(12) United States Patent
Currivan et al.

(10) Patent No.: US 8,009,075 B2
(45) Date of Patent: Aug. 30, 2011

(54) ANALOG TO DIGITAL CONVERTER (ADC) WITH EXTENDED DYNAMIC INPUT RANGE

(75) Inventors: Bruce J. Currivan, Dove Canyon, CA (US); Thomas J. Kolze, Phoenix, AZ (US); Lin He, Irvine, CA (US); Loke Tan, Newport Coast, CA (US); Ramon Gomez, San Juan Capistrano, CA (US); Francesco Gatta, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 10 days.

(21) Appl. No.: 12/453,431

(22) Filed: May 11, 2009

(65) Prior Publication Data

US 2010/0052967 A1 Mar. 4, 2010

Related U.S. Application Data

(60) Provisional application No. 61/136,353, filed on Aug. 29, 2008.

(51) Int. Cl.
*H03M 1/12* (2006.01)

(52) U.S. Cl. ........ 341/155; 341/132; 341/139; 341/158; 341/159

(58) Field of Classification Search .................. 341/132, 341/139, 14, 155, 158, 159
See application file for complete search history.

(56) References Cited

U.S. PATENT DOCUMENTS

| 5,777,569 | A * | 7/1998 | Naruki et al. | 341/155 |
| 6,097,324 | A * | 8/2000 | Myer et al. | 341/118 |
| 6,104,329 | A * | 8/2000 | Kawano | 341/139 |
| 6,191,725 | B1 * | 2/2001 | Lavoie | 342/92 |
| 6,377,196 | B1 * | 4/2002 | Kolsrud et al. | 341/118 |
| 6,621,433 | B1 * | 9/2003 | Hertz | 341/139 |
| 6,943,548 | B1 * | 9/2005 | Hertz | 324/309 |
| 2007/0103355 | A1 * | 5/2007 | Yamada | 341/155 |
| 2008/0218395 | A1 * | 9/2008 | Tomioka et al. | 341/155 |

* cited by examiner

*Primary Examiner* — Linh Nguyen
(74) *Attorney, Agent, or Firm* — Garlick Harrison & Markison; Shayne X. Short

(57) ABSTRACT

A method and apparatus is disclosed to extend a dynamic input range of an analog to digital converter (ADC). A composite ADC may include one or more ADCs. The one or more ADCs compare a signal metric of an analog input signal to quantization levels to produce intermediate digital output signals using one or more non-clipping input values. The composite ADC may select among the one or more intermediate digital output signals based on the signal metric of the analog input signal to produce a final digital output.

19 Claims, 7 Drawing Sheets

ANALOG TO DIGITAL CONVERTER (ADC) WITH EXTENDED DYNAMIC INPUT RANGE

CROSS-REFERENCE TO RELATED APPLICATIONS

The present application claims the benefit of U.S. Provisional Patent Appl. No. 61/136,353, filed Aug. 29, 2008, entitled "Analog to Digital Converter (ADC) with Extended Dynamic Input Range", which is incorporated by reference herein in its entirety.

BACKGROUND OF THE INVENTION

1. Field of the Invention

The present invention relates generally to analog to digital converters (ADC) communications receiver, more specifically to extending a dynamic input range of an ADC.

2. Related Art

An analog to digital converter (ADC) is an electronic circuit that converts an analog input to a digital output signal. The ADC includes one or more quantization levels to produce the digital output signal. Each quantization level may be assigned to a combination of bits, referred to as a codeword. The ADC selects a corresponding one of the quantization levels as a representation of the analog input. The ADC assigns the codeword corresponding to a selected quantization level to the digital output signal to convert the analog input to a digital representation.

A ratio between a most miniscule nonzero quantization level and a maximum quantization level may be referred to as a dynamic input range of the ADC, r, such that the dynamic range r is greater than or equal to one. Generally, the dynamic input range of the ADC is determined such that a maximum value of the analog input is less than or equal to the maximum quantization level, and/or a minimum value of the analog input is greater than or equal to the minimum quantization level. However, the minimum value of the analog input and/or the maximum value of the analog input may fall below the minimum quantization level and/or rise above the maximum quantization level, respectively, causing the ADC to saturate or clip. When clipping occurs, the digital output signal no longer accurately represents the analog input.

A conventional ADC may attenuate the analog input before conversion to the digital representation. Attenuation of the analog input in this manner ensures the maximum value level of the analog input does not exceed the maximum quantization level too often or by too much. As a result of this attenuation, each quantization level of the conventional ADC is required to convert a greater range of the analog input as observed prior to the attenuation, thereby reducing a resolution of the conventional ADC. This reduction in resolution of the conventional ADC corresponds to an increase in quantization noise of the conventional ADC relative to the analog input prior to its attenuation. To avoid this increased quantization noise in the presence of the attenuation, a number of the quantization levels of the conventional ADC may be increased in proportion to the attenuation. Increasing the number of quantization levels in this manner increases the dynamic input range of the conventional ADC. However, increasing the number of the quantization levels increases an area and a power consumption of the conventional ADC. Further, increasing the number of the quantization levels may cause an increase in a number of bits to be processed by signal processors that rely on the conventional ADC to provide an input.

Therefore, what is needed is an ADC with an extended dynamic input range but achieved without proportionately increasing the number of the quantization levels and/or reducing the effective resolution of the ADC.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 1:
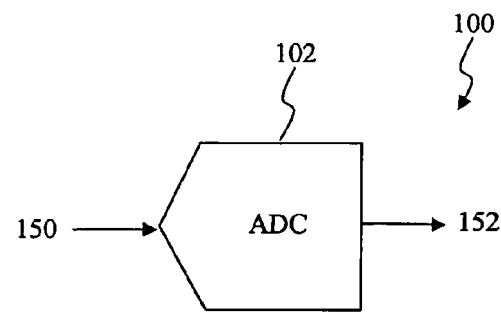
FIG. 1 illustrates a block diagram of a conventional analog to digital converter (ADC) module.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the present invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to effect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the present invention. Therefore, the Detailed Description is not meant to limit the present invention.

Rather, the scope of the present invention is defined only in accordance with the following claims and their equivalents.

The following Detailed Description of the exemplary embodiments will so fully reveal the general nature of the present invention that others can, by applying knowledge of those skilled in relevant art(s), readily modify and/or adapt for various applications such exemplary embodiments, without undue experimentation, without departing from the spirit and scope of the present invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

FIG. 1 illustrates a block diagram of a conventional analog to digital converter (ADC) module. A conventional ADC module 100 includes a conventional ADC 102 to convert an analog input signal 150 to a digital output signal 152. The analog input signal 150 may be greater than and/or less than a conventional non-clipping input value $m_c$. The analog input signal 150 may represent a total energy, a mean square, an instantaneous power, a root mean square, a variance, a norm, a voltage level, and/or any other suitable statistic of the analog input signal 150 which will be apparent to one skilled in the relevant art(s). The conventional non-clipping input value $m_c$ represents a value of the analog input signal 150 that when exceeded causes the conventional ADC 102 to saturate or clip. For example, the analog input 150 may represent a signed value including both positive values and negative values. In this situation, the conventional non-clipping input value $m_c$ may represent a maximum value of the analog input 150 for which the conventional ADC 102 does not clip. Alternatively, the analog input 150 may represent an unsigned value including only positive values. In this situation, the conventional non-clipping input value $m_c$ may represent the maximum value of the analog input 150 for which the conventional ADC 102 does not clip. In another alternative, the analog input 150 may represent another unsigned value including only negative values. In this situation, the conventional non-clipping input value $m_c$ may represent a minimum value of the analog input 150 for which the conventional ADC 102 does not clip.

The conventional ADC 102 determines a respective one of n quantization levels to assign to the analog input signal 150 to convert the analog input signal 150 from an analog representation to a digital representation. For example, when the analog input signal 150 is less than or equal to the conventional non-clipping input value $m_c$, the conventional ADC 102 assigns a unique digital value corresponding to a respective one of the n quantization levels to k bits of the digital output signal 152. However, when the analog input signal 150 is greater than or equal to the conventional non-clipping input value $m_c$, the conventional ADC 102 saturates or clips. In this situation, the conventional ADC 102 assigns the unique digital value corresponding to a maximum quantization level or a minimum quantization level to the k bits of the digital output signal 152. As a result of this clipping, the digital output signal 152 no longer accurately represents a digital representation of the analog input signal 150 that in turn causes a reduction in an output signal to noise ratio (SNR) of the conventional ADC module 100 as compared to the output SNR of the conventional ADC module 100 when not clipped.

Figure 2A:
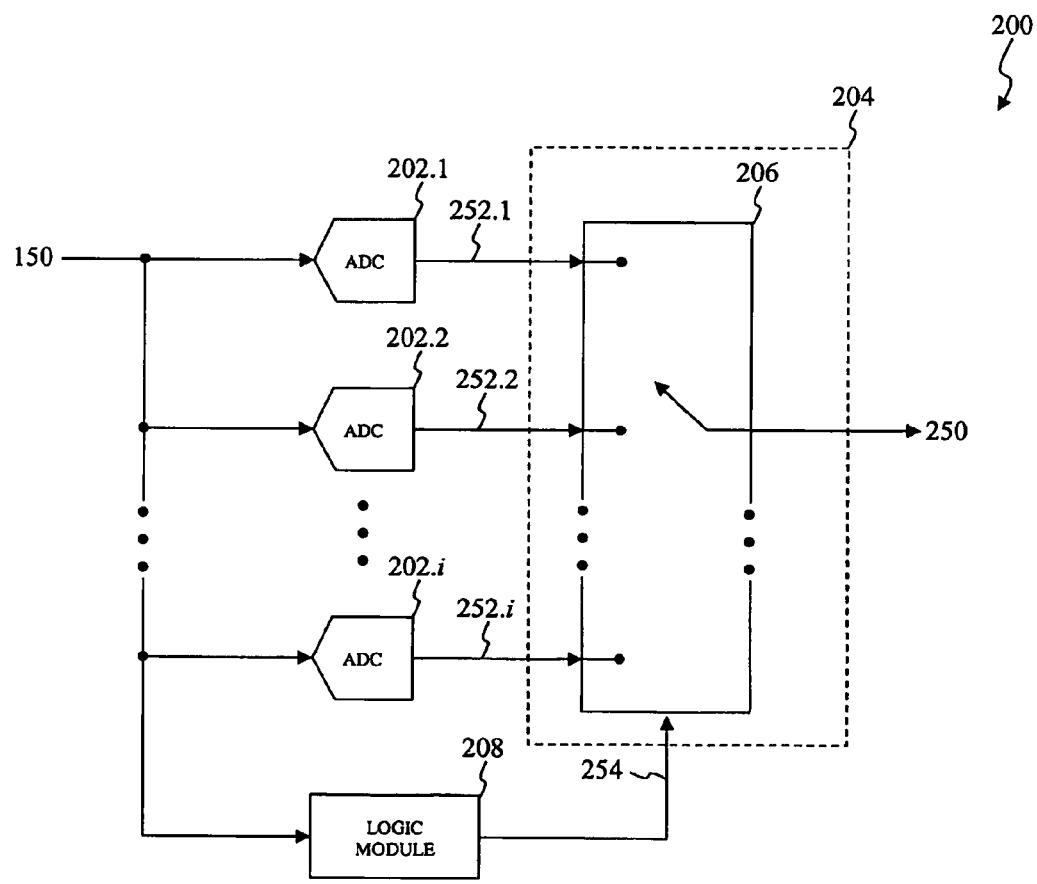
FIG. 2A illustrates a first block diagram of a composite ADC module according to a first embodiment of the present invention.

FIG. 2A illustrates a first block diagram of a composite ADC module according to a first embodiment of the present invention. A composite ADC module 200 converts the analog input signal 150 to a final digital output signal 250. The analog input signal 150 may be greater than and/or less than one or more non-clipping input values $m_{r1}$ through $m_{ri}$. Each of the non-clipping input values $m_{r1}$ through $m_{ri}$ may include a mean, a total energy, an average power, a mean square, an instantaneous power, a root mean square, a variance, a norm, a voltage level and/or any other suitable signal metric of the analog input signal 150 which will be apparent to one skilled in the relevant art(s).

The composite ADC module 200 includes one or more ADCs 202.1 through 202.i and a combining logic module 204. Each one of the ADCs 202.1 through 202.i corresponds to one of the non-clipping input values $m_{r1}$ through $m_{ri}$. In an exemplary embodiment, the non-clipping input values $m_{r1}$ through $m_{ri}$ are implemented in an increasing order such that a non-clipping input value having a lesser subscript, such as the non-clipping input value $m_{r1}$ to provide an example, is smaller than a non-clipping input value having a greater subscript, such as the non-clipping input value $m_{r2}$ to provide an example. Assuming that each one of the ADCs 202.1 through 202.i may be separated into a similar number of quantization levels, the ADCs 202.1 through 202.i corresponding to the non-clipping input value having the lesser subscript, such as the ADC 202.1 to provide an example, have a lesser quantization step size $\Delta_Q$ when compared to the ADCs 202.1 through 202.i corresponding to the non-clipping input value having the greater subscript. As a result of the lesser quantization step size $\Delta_Q$, a resolution of an ADC 202.1 through 202.i having a lesser subscript, such as the ADC 202.1 to provide an example, is substantially greater than or equal to a resolution of an ADC 202.1 through 202.i having a greater subscript, such as the ADC 202.2 to provide an example. However, this example is not limiting, those skilled in the relevant art(s) will recognize that each one of the ADCs 202.1 through 202.i may be separated into a dissimilar number of quantization levels without departing from the spirit and scope of the present invention.

The analog input signal 150 may be less than or equal to one or more of the non-clipping input values $m_{r1}$ through $m_{ri}$. In this situation, the ADCs 202.1 through 202.i having their corresponding non-clipping input value $m_{r1}$ through $m_{ri}$ greater than or equal to the analog input signal 150 assign a unique digital value corresponding to one of $n_1$ through $n_k$ quantization levels to j bits of the corresponding intermediate digital output signal 252.1 through 252.i. The ADCs 202.1 through 202.i may include a similar number of quantization levels or a dissimilar number of quantization levels. In an exemplary embodiment, each of the j bits of the ADCs 202.1 through 202.i corresponds to an equivalent number of bits. In another exemplary embodiment, at least one of the j bits may represent unique identifiers corresponding to the ADC 202.1 through 202.i that has generated the corresponding intermediate digital output signal 252.1 through 252.i. These unique identifiers are available to be used by one or more processors operating on the ADC output 250 to interpret scaling of the intermediate digital output signals 252.1 through 252.i. In general, the scaling of the intermediate digital output signals 252.1 through 252.i may differ between the ADCs 202.1 through 202.i, but the downstream processing associates the ADC with the scaling it used through the unique identifier bits. In another exemplary embodiment, the ADCs 202.1 through 202.i having their corresponding non-clipping input value $m_{r1}$ through $m_{ri}$ greater than or equal to the analog input signal 150 compare a signal metric of the analog input signal 150 to one or more of the $n_1$ through $n_k$ quantization levels to assign the unique digital value. The signal metric of the analog input signal 150 may include the mean, the total energy, the average power, the mean square, the instantaneous power, the root mean square, the variance, the norm, the voltage level and/or any other suitable signal metric of the analog input signal 150 which will be apparent to one skilled in the relevant art(s).

Alternatively, the analog input signal 150 may be greater than or equal to one or more of the non-clipping input values $m_{r1}$ through $m_{ri}$. In this situation, the ADCs 202.1 through 202.i having their corresponding non-clipping input value $m_{r1}$ through $m_{ri}$ less than or equal to the analog input signal 150 assign the unique digital value corresponding to a maximum quantization level or a minimum quantization level to the j bits of the corresponding intermediate digital output signal 252.1 through 252.i.

In another alternate, the analog input signal 150 may be greater than or equal to all of the non-clipping input values $m_{r1}$ through $m_{ri}$. In this situation, the ADCs 202.1 through 202.i assign the unique digital value corresponding to the maximum quantization level or the minimum quantization level to the j bits of the corresponding intermediate digital output signal 252.1 through 252.i.

The combining logic module 204 selects one of the intermediate digital output signals 252.1 through 252.i to represent the final digital output signal 250 based upon a selection signal 254. The combining logic module 204 includes a switching module 206. The switching module 206 selects one of the intermediate digital output signals 252.1 through 252.i to represent the final digital output signal 250 based on a selection signal 254. In general, the combining logic module 204 selects the intermediate digital output signal 252.1 through 252.i which has a smallest resolution among all the ADCs 202.1 through 202.i having their corresponding non-clipping input value $m_{r1}$ through $m_{ri}$ less than or equal to the analog input signal 150 to represent the final digital output signal 250.

The logic module 208 generates the selection signal 254 based on a signal metric of the analog input signal 150. The logic module 208 provides the selection signal 254 that causes the switching module 206 to select a first intermediate digital output signal, such as the intermediate digital output signal 252.1 to provide an example, as the final output 250 when the signal metric of the analog input signal 150 is less than or equal to a first non-clipping input value, such as the non-clipping input value $m_{r1}$ to provide an example. In an exemplary embodiment, the logic module 208 may include one or more thresholds, wherein each threshold from the one or more thresholds may be assigned to one of the non-clipping input values $m_{r1}$ through $m_{ri}$. For example, the logic module 208 provides the selection signal 254 that causes the switching module 206 to select the first intermediate digital output signal when the signal metric of the analog input signal 150 is less than or equal to a threshold corresponding to the first non-clipping input value. However, this example is not limiting, the logic module 208 may utilize other means to provide the selection signal 254 differently in accordance with the teaching herein without departing from the sprit and scope of the present invention.

Alternatively, the logic module 208 provides the selection signal 254 that causes the switching module 206 to select a second intermediate digital output signal, such as the intermediate digital output signal 252.2 to provide an example, as the final output 250 when the signal metric of the analog input signal 150 is greater than or equal to the first non-clipping input value, but less than a second non-clipping input value, such as the non-clipping input value $m_{r2}$ to provide an example. However, if the signal metric of the analog input signal 150 returns to being less than or equal the first non-clipping input value, the logic module 208 provides the selection signal 254 that causes the switching module 206 to once again select the first intermediate digital output signal as the final output 250.

In another alternate, the logic module 208 provides the selection signal 254 that causes the switching module 206 to select any of the intermediate digital output signals 252.1 through 252.i as the final output 250 when the signal metric of the analog input signal 150 exceeds a maximum non-clipping input value, such as the non-clipping input value $m_{ri}$ to provide an example. In this situation, the logic module 208 usually produces the selection signal 254 that causes the switching module 206 to select the intermediate digital output signal 252.1 through 252.i corresponding to an ADC 202.1 through 202.i corresponding to the maximum non-clipping input value.

Figure 2B:
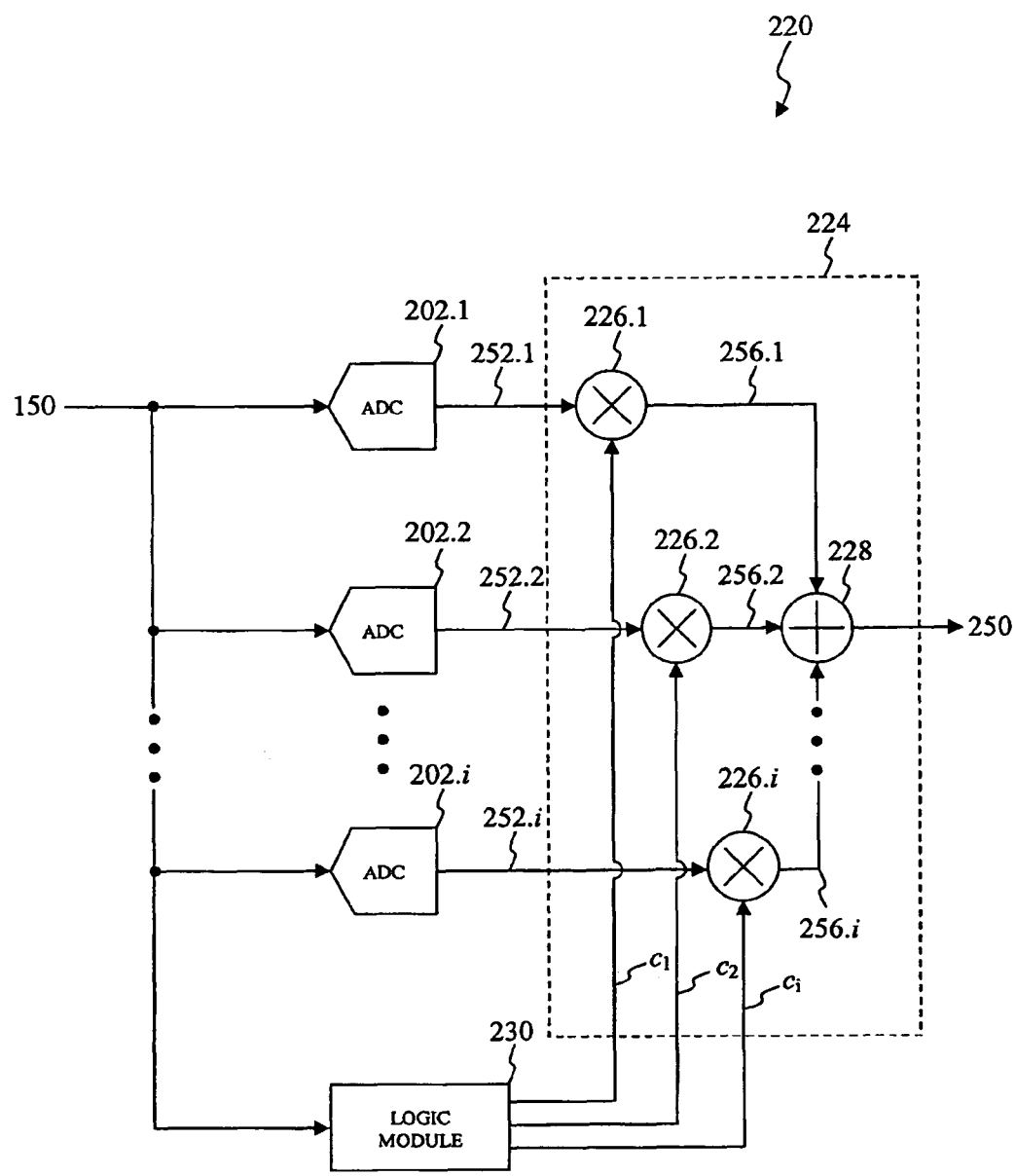
FIG. 2B illustrates a second block diagram of a composite ADC module according to a second embodiment of the present invention.

FIG. 2B illustrates a second block diagram of a composite ADC module according to a second embodiment of the present invention. A composite ADC module 220 converts the analog input signal 150 to the final digital output signal 250. The composite ADC module 200 includes the one or more ADCs 202.1 through 202.i, as described above in FIG. 2A, and a combining logic module 224.

The combining logic module 224 may provide one or more linear combinations of the intermediate digital output signals 252.1 through 252.i to represent the final digital output signal 250. The combining logic module 224 includes multipliers 226.1 through 226.i and a summation network 228. The multipliers 226.1 through 226.i multiply the intermediate digital output signals 252.1 through 252.i and a corresponding coefficient $c_1$ through $c_i$ to provide a corresponding partial product output 256.1 through 256.i. For example, the multiplier 226.1 may multiply the intermediate digital output signal 252.1 and the coefficient $c_1$ to provide the partial product 256.1. The summation network 228 combines the partial product output 256.1 through 256.i to provide the final output 250.

The logic module 230 provides the coefficients $c_1$ through $c_i$ based on the signal metric of the analog input signal 150. The logic module 230 provides the coefficients $c_1$ through $c_i$ to the multipliers 226.1 through 226.i such that the final output 250 may be represented as:

$$OUT_{FINAL} = c_1 * ADC_1 + c_2 * ADC_2 + \ldots + c_i * ADC_i, \quad (1)$$

where $OUT_{FINAL}$ represents the final output 250, $c_1$ through $c_i$ represent the coefficients $c_1$ through $c_i$, and $ADC_1$ through $ADC_i$ represent outputs of the ADCs 202.1 through 202.i, namely the intermediate digital output signals 252.1 through 252.i.

The logic module 230 provides a first set of the coefficients $c_1$ through $c_i$ that cause the combining logic module 224 to provide a first linear combination of the intermediate digital output signals 252.1 through 252.i as the final output 250 when the signal metric of the analog input signal 150 is less than a first non-clipping input value, such as the non-clipping input value $m_{r1}$ to provide an example. In an exemplary embodiment, the logic module 230 may include one or more thresholds, wherein each threshold from the one or more thresholds may be assigned to one of the non-clipping input values $m_{r1}$ through $m_{ri}$. For example, the logic module 230 provides the first set of the coefficients $c_1$ through $c_i$ when the signal metric of the analog input signal 150 is less than or equal to a threshold corresponding to the first non-clipping input value. However, this example is not limiting, the logic module 230 may utilize other means to provide the set of the coefficients $c_1$ through $c_i$ differently in accordance with the teaching herein without departing from the sprit and scope of the present invention.

Alternatively, the logic module 230 provides a second set of the coefficients $c_1$ through $c_i$ that cause the combining logic module 224 to provide a second linear combination of the intermediate digital output signals 252.1 through 252.i as the final output 250 when the signal metric of the analog input signal 150 is greater than or equal the first non-clipping input value, but less a second non-clipping input value, such as the non-clipping input value $m_{r2}$ to provide an example. In an exemplary embodiment, those coefficients in the second set of the coefficients $c_1$ through $c_i$ corresponding to one or more ADCs whose non-clipping input value is less than the signal metric of the analog input signal 150 are set to zero, such that its respective intermediate digital output signals 252.1 through 252.i does not contribute to the final output 250. However, if the signal metric of the analog input signal 150 returns to being less than or equal to the first non-clipping input value, the logic module 230 provides the first set of the coefficients $c_1$ through $c_i$ that cause the combining logic module 224 to provide the first linear combination of the intermediate digital output signals 252.1 through 252.i as the final output 250.

In another alternate, the logic module 230 provides any set of the coefficients $c_1$ through $c_i$ that cause the combining logic module 224 to provide any linear combination of the intermediate digital output signals 252.1 through 252.i as the final output 250 when the signal metric of the analog input signal 150 exceeds all non-clipping input values. In this situation, the logic module 230 usually provides the coefficients $c_1$ through $c_i$ that cause the combining logic module 224 to provide one of the intermediate digital output signals 252.1 through 252.i associated with one of the ADCs 202.1 through 202.i having a largest non-clipping input value as the final output 250. For example, the logic module 230 usually provides the coefficients $c_1$ through $c_i$ that causes only the intermediate digital output signal 252.i to contribute to final output 250.

Figure 3:
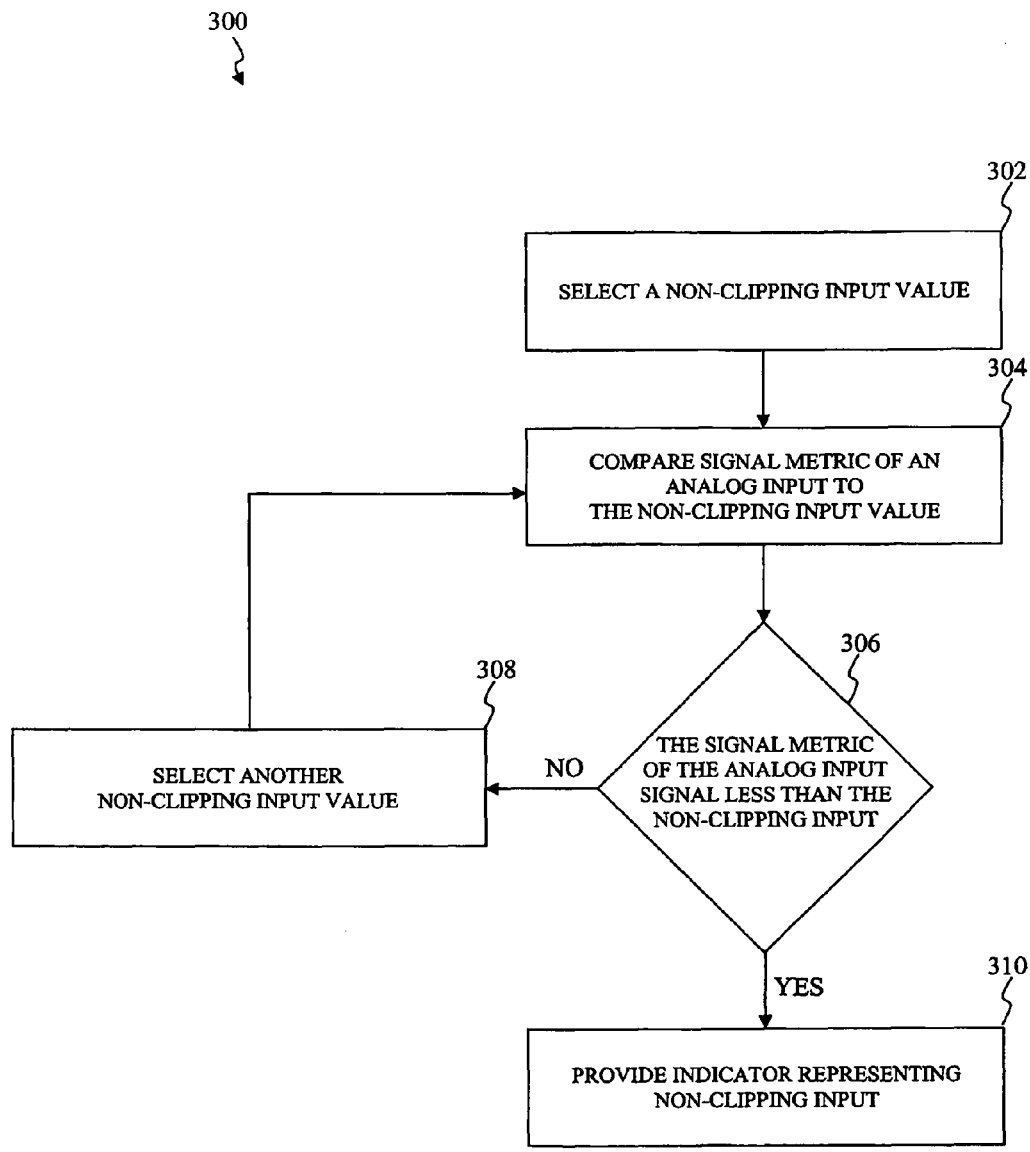
FIG. 3 is a flowchart of exemplary operational steps of a first logic module used in the composite ADC module according to a first of the present invention.

FIG. 3 is a flowchart of exemplary operational steps of a first logic module used in the composite ADC module according to a first embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 3.

At step 302, an operational control flow 300 selects a non-clipping input value from one or more non-clipping input values, such as the non-clipping input values $m_{r1}$ through $m_{ri}$. Each of the non-clipping input values may include a mean, a total energy, an average power, a mean square, an instantaneous power, a root mean square, a variance, a norm, a voltage level and/or any other suitable signal metric of an analog input signal, such as the analog signal 150 to provide an example, which will be apparent to one skilled in the relevant art(s). In an exemplary embodiment, the operational control flow 300 may include one or more thresholds, wherein each threshold from the one or more thresholds may be assigned to one of the non-clipping input values.

At step 304, the operational control flow 300 compares a signal metric of the analog input signal and the non-clipping input value of step 302. The signal metric of the analog input signal may include the mean, the total energy, the average power, the mean square, the instantaneous power, the root mean square, the variance, the norm, the voltage level and/or any other suitable signal metric of the analog input signal which will be apparent to one skilled in the relevant art(s).

At step 306, the operational control flow 300 proceeds to step 308 when the signal metric from step 304 is greater than or equal to the non-clipping input value of step 302. Otherwise, the operational control flow 300 proceeds to step 310 when the signal metric from step 304 is less than or equal to the non-clipping input value of step 302

At step 308, the signal metric from step 304 is greater than or equal to the non-clipping input value of step 302 and/or the another non-clipping input value from step 308. The operational control flow 300 selects another non-clipping input value from the one or more non-clipping input values. The operational control flow 300 reverts back to step 306 to compare the signal metric of the analog input signal from step 304 and the another non-clipping input value.

At step 310, the signal metric from step 304 is less than or equal to the non-clipping input value of step 302. The operational control flow 300 provides an indicator of the non-clipping input value of step 302 and/or the another non-clipping input value from step 308 that is greater than or equal to the signal metric from step 304. The operational control flow 300 may provide a selection signal, such as the selection signal 254 to provide an example, that corresponds to the non-clipping input value of step 302 and/or the another non-clipping input value from step 308. The selection signal causes one or more digital representations of the analog input signal corresponding to the non-clipping input value of step 302 and/or the another non-clipping input value from step 308 to be selected as a final digital output, such as the final output 250 to provide an example. Alternatively, the operational control flow 300 may provide a set of coefficients, such as the coefficients $c_1$ through $c_i$ to provide an example, that corresponds to the non-clipping input value of step 302 and/or the another non-clipping input value from step 308. The set of coefficients may be used to provide a linear combination of the one or more digital representations of the analog input signal as the final digital output.

Figure 4:
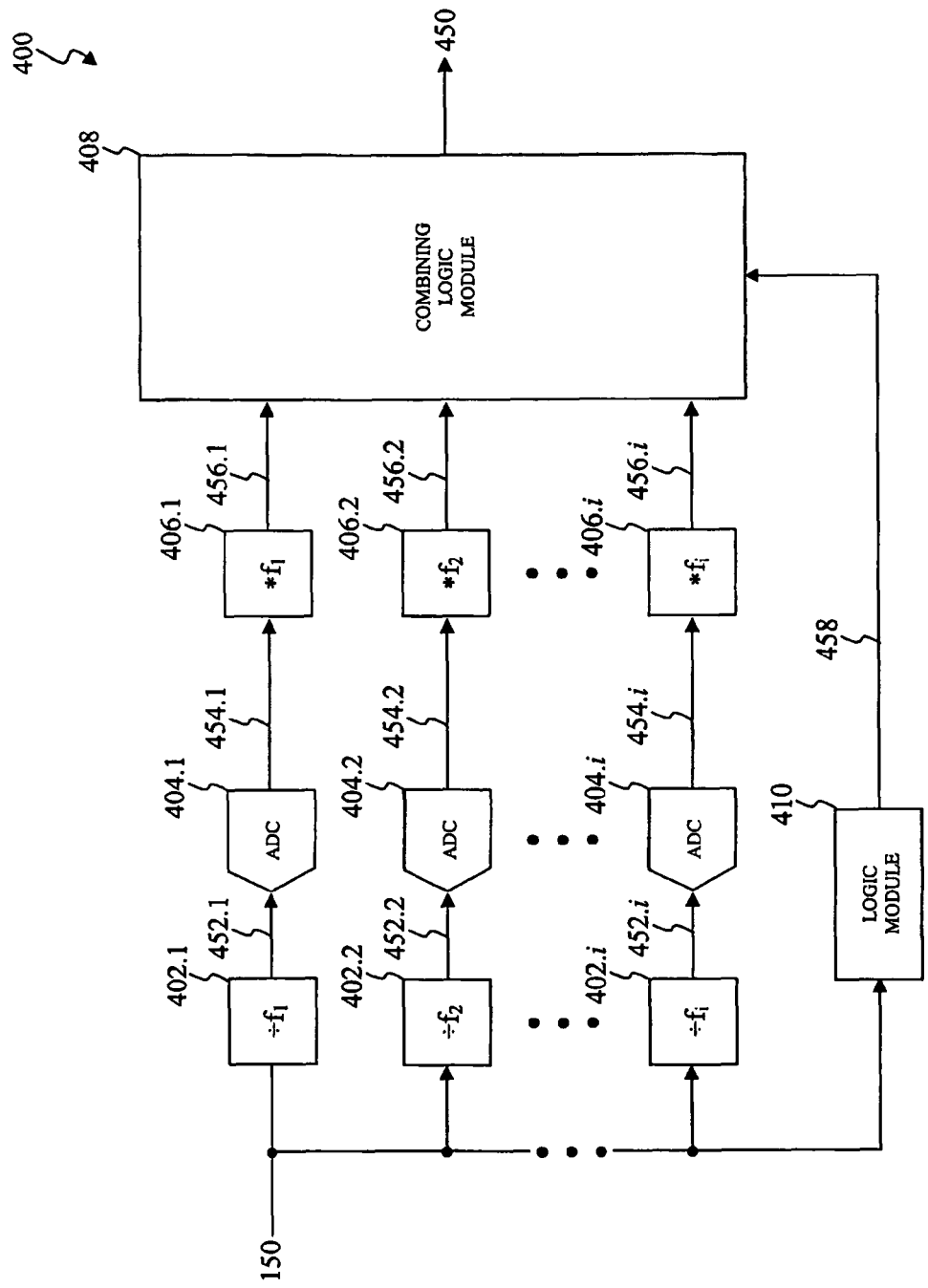
FIG. 4 illustrates a third block diagram of a composite ADC module according to a third embodiment of the present invention.

FIG. 4 illustrates a third block diagram of a composite ADC module according to a third embodiment of the present invention. A composite ADC module 400 converts the analog input signal 150 to a final digital output signal 450. The composite ADC module 400 includes one or more first scaling modules 402.1 through 402.i, one or more ADCs 404.1 through 404.i, one or more second scaling modules 406.1 through 406.i, a combining logic module 408, and a logic module 410.

The first scaling modules 402.1 through 402.i scale the analog input signal 150 by a scaling factor $f_1$ through $f_i$ to provide one or more scaled analog input signals 452.1 through 452.i. More specifically, the first scaling modules 402.1 through 402.i divide the analog input signal 150 by the scaling factors $f_1$ through $f_i$ to provide the scaled analog input signals 452.1 through 452.i. For example, the first scaling module 402.1 divides the analog input signal 150 by the scaling factor $f_1$ to provide the scaled analog input signal 452.1. In an exemplary embodiment, the scaling factors $f_1$ through $f_i$ are implemented in an increasing order such that a scaling factor having a lesser subscript, such as the scaling factor $f_1$ to provide an example, is smaller than a scaling factor having a greater subscript, such as the scaling factor $f_2$ to provide an example.

The ADCs 404.1 through 404.i may include a corresponding scaling step size $\Delta_S$. The scaling step size $\Delta_S$ for a respective ADC 404.1 through 404.i represents an effective quantization step size of the respective ADC 404.1 through 404.i referenced to the analog input signal 150. The scaling step size $\Delta_S$ may be represented as:

$$\Delta_S = (\text{scaling factor})^*(\text{quantization step size}), \quad (2)$$

where $\Delta_S$ represents the scaling step size $\Delta_S$ of a respective one of the ADCs 404.1 through 404.i, scaling factor represents one of the scaling factors $f_1$ through $f_i$ corresponding to the respective one of the ADCs 404.1 through 404.i, and quantization step size represents quantization step size of the respective one of the ADCs 404.1 through 404.i. For example, the scaling step size $\Delta_S$ of the ADCs 404.1 may be represented as:

$$\Delta_{S1} = (f_1)^*(\Delta_{Q1}), \quad (3)$$

where $\Delta_{S1}$ represents the scaling step size $\Delta_S$ of the ADC 404.1, $f_1$ represents the scaling factor $f_1$ corresponding to the ADC 404.1, and $\Delta_{Q1}$ represents the quantization step size of the ADC 404.1 through 404.i. The first scaling module 402.1 through 402.i corresponding to the scaling factor having the lesser subscript, such as the first scaling module 402.1 to provide an example, have a lesser scaling step size $\Delta_S$ when compared to the first scaling modules 402.1 through 402.i corresponding to the scaling factor having the greater subscript. As a result of the lesser scaling step size $\Delta_S$, a resolution of an ADC 402.1 through 402.i having a lesser subscript, such as the ADC 402.1 to provide an example, is substantially greater than or equal to a resolution of an ADC 402.1 through 402.i having a greater subscript, such as the ADC 402.2 to provide an example.

The ADCs 404.1 through 404.i convert the scaled analog input signals 452.1 through 452.i to scaled digital output signals 454.1 through 454.i. Each of the ADCs 404.1 through 404.i may have a non-clipping input value $m_r$, which in one embodiment, is substantially the same for each of the ADCs 404.1 through 404.i. The non-clipping input value $m_r$ represents a value of the scaled analog input signals 452.1 through 452.i that when exceeded causes a corresponding ADC 404.1 through 404.i to clip. More specifically, the non-clipping input value $m_r$ represents a ratio of the analog input signal 150 and a corresponding scaling factor $f_1$ through $f_i$ that when exceeded causes the corresponding ADC 404.1 through 404.i to clip. For example, the ADC 404.1 clips when the ratio of the analog input signal 150 and the scaling factor $f_1$ exceeds the non-clipping input value $m_r$. Likewise, the ADC 404.i clips when the ratio of the analog input signal 150 and the scaling factor $f_i$ exceeds the non-clipping input value $m_r$.

One or more of the scaled analog input signals 452.1 through 452.i may be less than or equal to the non-clipping input value $m_r$. In this situation, the ADCs 402.1 through 402.i having their corresponding non-clipping input value $m_r$ greater than or equal to the one or more scaled analog input signals 452.1 through 452.i assign a unique digital value corresponding to one of $n_1$ through $n_k$ quantization levels to p bits of the corresponding scaled digital output signal 454.1 through 454.i. The ADCs 402.1 through 402.i may include a similar number of quantization levels or a dissimilar number of quantization levels. In an exemplary embodiment, each of the p bits of the ADCs 404.1 through 404.i corresponds to an equivalent number of bits. In another exemplary embodiment, the ADCs 402.1 through 402.i having their corresponding non-clipping input value $m_r$ greater than or equal to the analog input signal 150 compare a signal metric of the corresponding scaled analog input signal 452.1 through 452.i to one or more of $n_1$ through $n_k$ quantization levels to assign the unique digital value. The signal metric of the corresponding scaled analog input signal 452.1 through 452.i may include the mean, the total energy, the average power, the mean square, the instantaneous power, the root mean square, the variance, the norm, the voltage level and/or any other suitable signal metric of the analog input signal 150 which will be apparent to one skilled in the relevant art(s).

Alternatively, one or more of the scaled analog input signals 452.1 through 452.i may be greater than or equal to one or more of the non-clipping input value $m_r$. In this situation, the ADCs 402.1 through 402.i having their corresponding non-clipping input value $m_r$ less than or equal to the one or more scaled analog input signals 452.1 through 452.i assign the unique digital value corresponding to a maximum quantization level or a minimum quantization level to the p bits of the corresponding intermediate digital output signal 452.1 through 452.i.

In another alternate, all of the of the scaled analog input signals 452.1 through 452.i may be greater than or equal to one or more of the non-clipping input value $m_r$. In this situation the ADCs 402.1 through 402.i assign the unique digital value corresponding to a maximum quantization level or a minimum quantization level to the p bits of the corresponding intermediate digital output signal 452.1 through 452.i.

The second scaling modules 406.1 through 406.i scale the scaled digital output signals 454.1 through 454.i by the corresponding scaling factor $f_1$ through $f_i$ to provide composite digital output signals 456.1 through 456.i. More specifically, the second scaling modules 406.1 through 406.i multiply the scaled digital output signals 454.1 through 454.i by the corresponding scaling factor $f_1$ through $f_i$. For example, the second scaling module 406.1 multiplies the scaled digital output signal 454.1 by the scaling factor $f_1$ to provide the composite digital output signal 456.1. The scaling factors $f_1$ through $f_i$ of the second scaling modules 406.1 through 406.i are substantially similar to the scaling factors $f_1$ through $f_i$ of the first scaling modules 402.1 through 402.i. In an exemplary embodiment, the scaling factors $f_1$, through $f_i$ of the second scaling modules 406.1 through 406.i are equal to the scaling factors $f_1$, through $f_i$ of the first scaling modules 402.1 through 402.i.

In a first exemplary embodiment, the combining logic module 408 selects one of the composite digital output signals 456.1 through 456.i to represent the final digital output signal 450 based upon a logic control signal 458 in a similar manner as the combining logic module 204 as discussed above. The logic module 410 generates the logic control signal 458 based on a signal metric of the analog input signal 150. The logic module 410 provides the logic control signal 458 that causes the combining logic module 408 to select a first composite digital output signal, such as the composite digital output 456.1 to provide an example, as the final output 450 when a ratio of a first scaling factor, such as the scaling factor $f_1$ to provide an example, and the signal metric of the analog input signal 150 is less than or equal the non-clipping input value $m_r$. In an exemplary embodiment, the logic module 410 may include a threshold assigned to the non-clipping input value $m_r$. For example, the logic module 410 provides the logic control signal 458 that causes the combining logic module 408 to select the first composite digital output signal when the ratio of a first scaling factor, such as the scaling factor $f_1$ to provide an example, and the signal metric of the analog input signal 150 is less than or equal the threshold. However, this example is not limiting, the logic module 410 may utilize other means to provide the logic control signal 458 differently in accordance with the teaching herein without departing from the sprit and scope of the present invention.

Alternatively, the logic module 410 provides the logic control signal 458 that causes the combining logic module 408 to select a second composite digital output signal, such as the composite digital output signal 456.2 to provide an example, as the final output 450 when a ratio of a second scaling factor, such as the scaling factor $f_2$ to provide an example, and the signal metric of the analog input signal 150 is less than or equal to the non-clipping input value $m_r$ and the ratio of the first scaling factor and the signal metric of the analog input signal 150 is greater than the non-clipping input value $m_r$. However, if the ratio of the first scaling factor and the signal metric of the analog input signal 150 returns to being less than or equal non-clipping input value $m_r$, the logic module 410 provides the logic control signal 458 that causes the combining logic module 408 to once again select the first composite digital output signal as the final output 450.

In another alternate, the logic module 410 provides the logic control signal 458 that causes the combining logic module 408 to select any of the composite digital output signals 456.1 through 456.i as the final output 450 when ratios for each of the scaling factors $f_1$ through $f_i$ and the signal metric of the analog input signal 150 exceed the non-clipping input value $m_r$. In this situation, the logic module 410 usually produces the logic control signal 458 that causes the combining logic module 408 to select the composite digital output signal 456.1 through 456.i corresponding to a combination of a first scaling module 402.1 through 402.i and a second scaling module 406.1 through 406.i corresponding to a maximum scaling factor, such as the scaling factor $f_i$ to provide an example.

Alternatively, in a second exemplary embodiment, the combining logic module 408 may provide one or more linear combinations of the composite digital output signals 456.1 through 456.i to represent the final digital output signal 450 based upon the logic control signal 458 in a similar manner as the combining logic module 224 as discussed above.

The logic module 410 provides a first set of the coefficients $c_1$ through $c_i$ that cause the combining logic module 408 to provide a first linear combination of the composite digital output signals 456.1 through 456.i as the final output 450 when a ratio of a first scaling factor, such as the scaling factor $f_1$ to provide an example, and the signal metric of the analog input signal 150 is less than or equal the non-clipping input value $m_r$. In an exemplary embodiment, the logic module 410 may include a threshold assigned to the non-clipping input value $m_r$. For example, the logic module 410 provides the first set of the coefficients $c_1$ through $c_i$ that cause the combining logic module 408 to provide a first linear combination of the composite digital output signals 456.1 through 456.i as the final output 450 when a ratio of a first scaling factor, such as the scaling factor $f_1$ to provide an example, and the signal metric of the analog input signal 150 is less than or equal to the threshold. However, this example is not limiting, the logic module 410 may utilize other means to provide the logic control signal 458 differently in accordance with the teaching herein without departing from the sprit and scope of the present invention.

Alternatively, the logic module 410 provides a second set of the coefficients $c_1$ through $c_i$ that cause the combining logic module 408 to provide a second linear combination of the composite digital output signals 456.1 through 456.i as the final output 450 when a ratio of a second scaling factor, such as the scaling factor $f_2$ to provide an example, and the signal metric of the analog input signal 150 is less than or equal to the non-clipping input value $m_r$ and the ratio of the first scaling factor and the signal metric of the analog input signal 150 is greater than the non-clipping input value $m_r$. However, if the ratio of the first scaling factor and the signal metric of the analog input signal 150 returns to being less than or equal non-clipping input value $m_r$, the logic module 410 provides the first set of the coefficients $c_1$ through $c_i$ that causes the combining logic module 408 to once again provide the first linear combination of the composite digital output signals 456.1 through 456.i as the final output 450.

In another alternate, the logic module 410 provides any set of the coefficients $c_1$ through $c_i$ that cause the combining logic module 408 to provide any linear combination of the composite digital output signals 456.1 through 456.i as the final output 450 when ratios for each of the scaling factors $f_1$ through $f_i$ and the signal metric of the analog input signal 150 exceed the non-clipping input value $m_r$. In this situation, the combining logic module 408 usually provides the coefficients $c_1$ through $c_i$ that cause the combining logic module 408 to provide one of the composite digital output signals 456.1 through 456.i associated with one of the ADCs 404.1 through 404.i having a largest scaling factor as the final output 450. For example, the combining logic module 408 usually provides the coefficients $c_1$ through $c_i$ that causes only the composite digital output signal 456.i to contribute to final output 250.

In a further alternate, the second scaling modules 406.1 through 406.i are optional. In this situation, the scaling factors $f_1$ through $f_i$ corresponding to the second scaling modules 406.1 through 406.i may be incorporated into the coefficients $c_1$ through $c_i$ by the logic module 410.

Figure 5:
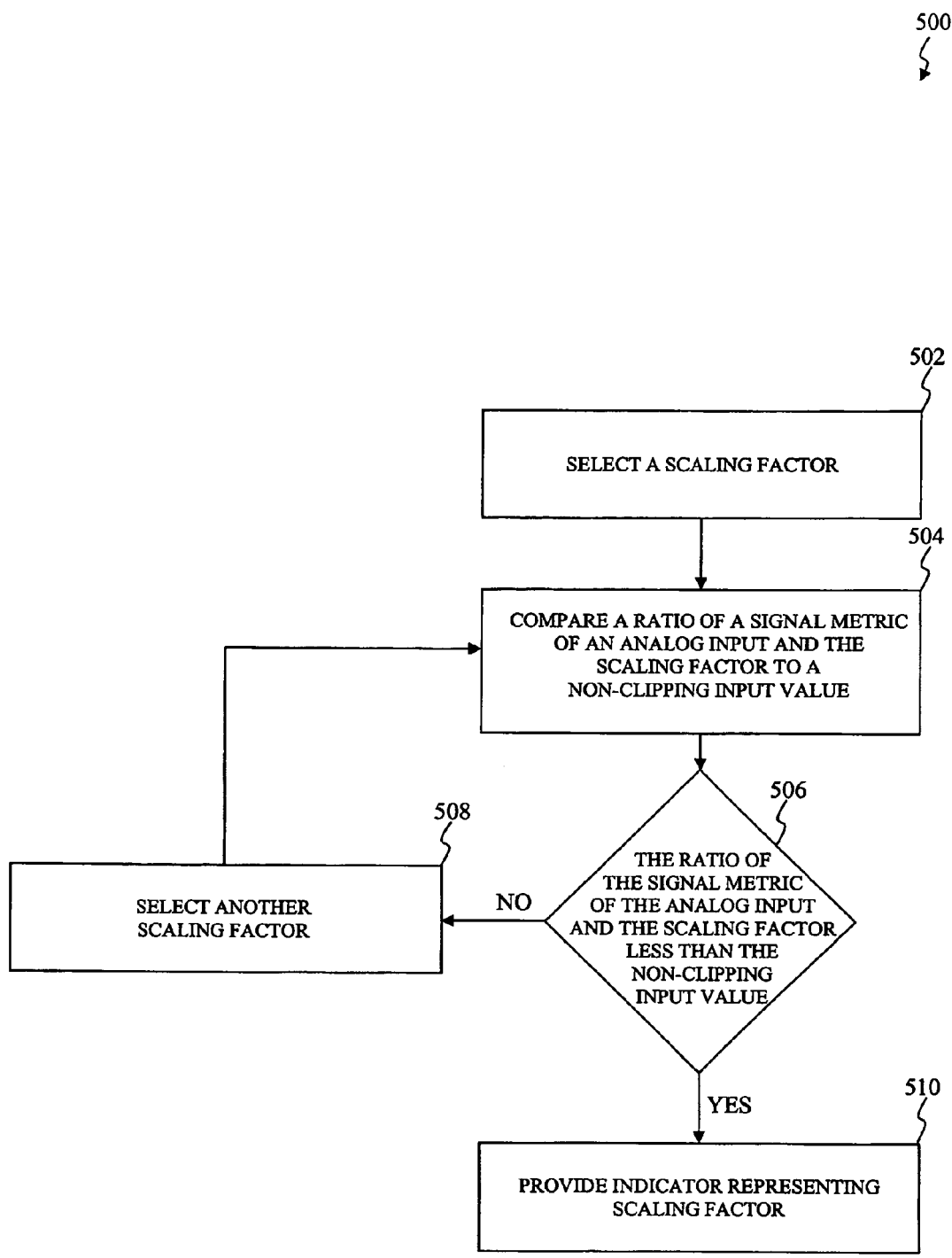
FIG. 5 is a flowchart of exemplary operational steps of a second logic module used in the composite ADC module according to a second aspect of the present invention.

FIG. 5 is a flowchart of exemplary operational steps of a second logic module used in the composite ADC module according to a second aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 5.

At step 502, an operational control flow 500 selects a scaling factor from one or scaling factors, such as the scaling factor $f_1$ through $f_i$.

At step 504, the operational control flow 500 compares a ratio of a signal metric of an analog input and the scaling factor from step 502 to a non-clipping input value, such as the non-clipping input value $m_r$ to provide an example. The non-clipping input value represents a ratio of the signal metric of the analog input signal and the scaling factor from step 502 that when exceeded causes one or more ADCs, such as the ADCs 404.1 through 404.i to provide an example, to clip. The signal metric of the analog input signal may include the mean, the total energy, the average power, the mean square, the instantaneous power, the root mean square, the variance, the norm, the voltage level and/or any other suitable signal metric of the analog input signal which will be apparent to one skilled in the relevant art(s).

At step 506, the operational control flow 500 proceeds to step 508 when the ratio of the signal metric of an analog input from step 504 and the scaling factor from step 502 is greater than or equal to the non-clipping input value of step 504. Otherwise, the operational control flow 500 proceeds to step 510 when the ratio of the signal metric of the analog input from step 504 and the scaling factor from step 502 is less than or equal to the non-clipping input value of step 502.

At step 508, the ratio of the signal metric of the analog input from step 504 and the scaling factor from step 502 is greater than or equal to the non-clipping input value of step 502 and/or the another non-clipping input value from step 508. The operational control flow 500 selects another scaling factor from the one or more scaling factors. The operational control flow 500 reverts back to step 506 to compare the ratio of the signal metric of an analog input and the another scaling factor to the non-clipping input value.

At step 510, the ratio of the signal metric of the analog input from step 504 and the scaling factor from step 502 is less than or equal to the non-clipping input value of step 502. The operational control flow 500 provides an indicator of the scaling factor of step 502 being greater than a ratio of the signal metric of the analog input from step 504 and the non-clipping input value of step 502. The operational control flow 500 may provide a logic control signal, such as the logic control signal 410 to provide an example, that corresponds to the scaling factor of step 502. The logic control signal causes one or more digital representations of the analog input signal corresponding to the logic control signal to be selected as a final digital output, such as the final output 450 to provide an example. Alternatively, the operational control flow 500 may provide a set of coefficients, such as the coefficients $c_1$ through $c_i$ to provide an example, via the logic control signal that corresponds to the scaling factor of step 502. The set of coefficients may be used to provide a linear combination of the one or more digital representations of the analog input signal as the final digital output.

Figure 6:
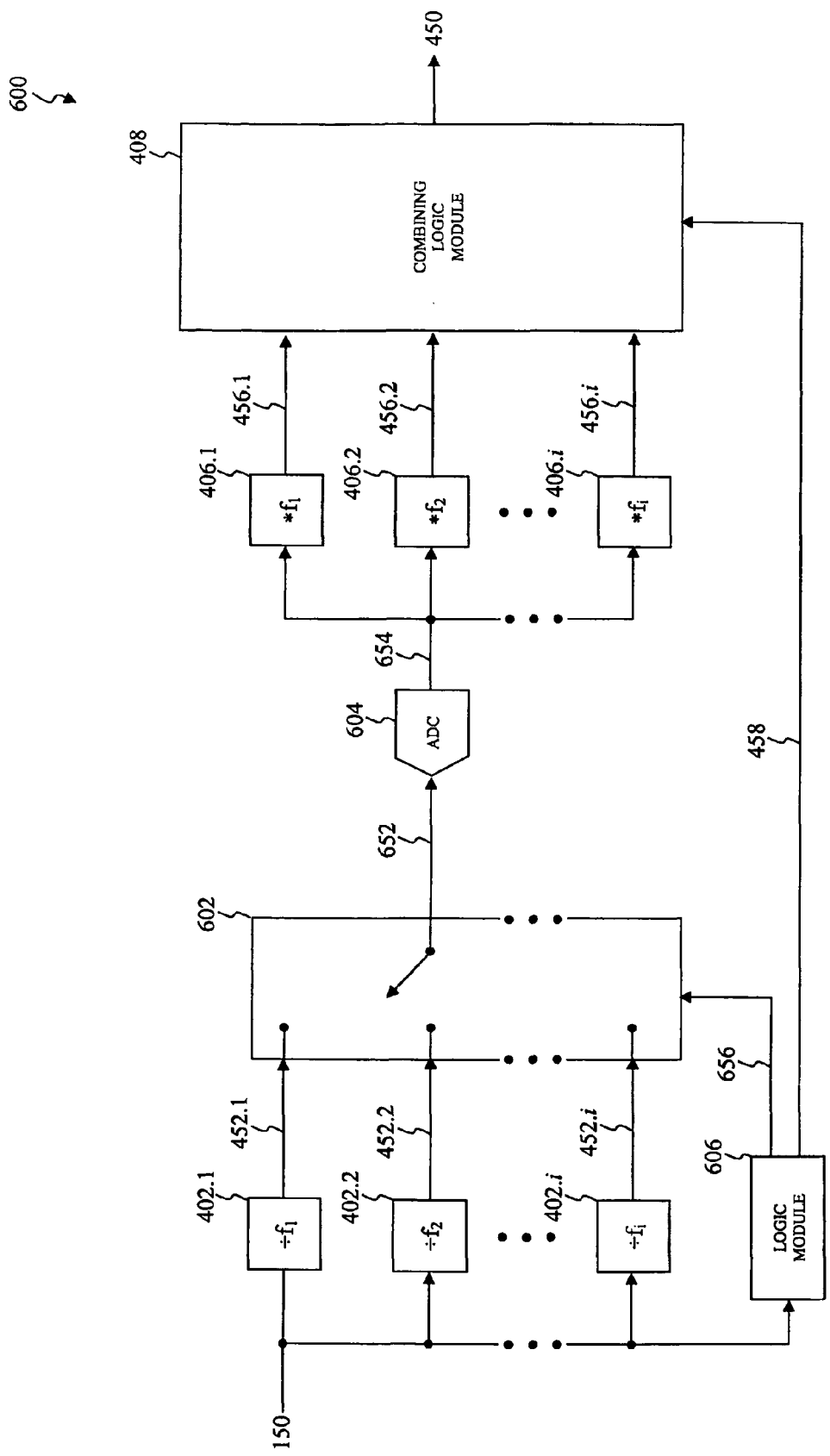
FIG. 6 illustrates a fourth block diagram of a composite ADC module according to a fourth embodiment of the present invention.

FIG. 6 illustrates a fourth block diagram of a composite ADC module according to a fourth embodiment of the present invention. A composite ADC module 600 converts the analog input signal 150 to a final digital output signal 450. The composite ADC module 600 includes the first scaling modules 402.1 through 402.i, the second scaling modules 406.1 through 406.i, the combining logic module 408, a selecting module 602, an ADC 604, and a logic module 606.

The first scaling modules 402.1 through 402.i scale the analog input signal 150 by the scaling factors $f_1$ through $f_i$, as discussed above, to provide the scaled analog input signals 452.1 through 452.i. More specifically, the first scaling modules 402.1 through 402.i divide the analog input signal 150 by the scaling factors $f_1$ through $f_i$ to provide the scaled analog input signals 452.1 through 452.i.

The ADC 604 converts the final analog input signal 652 to a scaled digital output signal 654. The ADC 604 may have a non-clipping input value $m_r$. The non-clipping input value $m_r$ represents a value of the final analog input signal 652 that when exceeded causes the ADC 604 to clip. More specifically, the non-clipping input value $m_r$ represents a ratio of the analog input signal 150 and a corresponding scaling factor $f_1$ through $f_i$ that when exceeded causes the ADC 604 to clip. For example, the ADC 604 clips when the ratio of the analog input signal 150 and the scaling factor $f_1$ exceeds the non-clipping input value $m_r$.

The selecting module 602 selects one of the scaled analog input signals 452.1 through 452.i to represent a final analog input signal 652 based upon an analog selection signal 656. Alternatively, the selecting module 602 selects more than one of the scaled analog input signals 452.1 through 452.i in a sequence using a track-and-hold functionality. In this situation, the first scaling modules 402.1 through 402.i includes the track-and-hold functionality such that each of the scaled analog input signals 452.1 through 452.i represents a sample of the analog input signal 150 at substantially similar instance in time with a different scaling factor $f_1$ through $f_i$ applied. With either one or more than one scaled sample from a given sampling time, one or more of the scaled analog input signals 452.1 through 452.i may be less than or equal to the non-clipping input value $m_r$. In this situation, the selecting module 602 selects the scaled analog input signal 452.1 through 452.i corresponding to a greatest scaling factor that is less than or equal to the non-clipping input value $m_r$ to represent the final analog input signal 652. The ADC 604 assigns a unique digital value corresponding to one of $n_1$ through $n_k$ quantization levels to r bits of the scaled digital output signal 654. In an exemplary embodiment, the ADC 604 compares a signal metric of the final analog input signal 652 to one or more of the $n_1$ through $n_k$ quantization levels to assign the unique digital value. The signal metric of the final analog input signal 652 may include the mean, the total energy, the average power, the mean square, the instantaneous power, the root mean square, the variance, the norm, the voltage level and/or any other suitable signal metric of the analog input signal 150 which will be apparent to one skilled in the relevant art(s).

Alternatively, all of the of the scaled analog input signals 452.1 through 452.i may be greater than or equal to the non-clipping input value $m_r$. The selecting module 602 selects any one of the scaled analog input signals 452.1 through 452.i to represent the final analog input signal 652. In this situation, the selecting module 602 usually selects the scaled analog input signal 452.1 through 452.i corresponding to a greatest scaling factor. The ADC 604 assigns the unique digital value corresponding to a maximum quantization level or a minimum quantization level to the r bits of the scaled digital output signal 654.

The second scaling modules 406.1 through 406.i scale the scaled digital output signal 654 by the corresponding scaling factor $f_1$ through $f_i$ to provide composite digital output signals 456.1 through 456.i. More specifically, the second scaling modules 406.1 through 406.i multiply the scaled digital output signals 454.1 through 454.i by the corresponding scaling factor $f_1$ through $f_i$.

In a first exemplary embodiment, the combining logic module 408 selects one of the composite digital output signals 456.1 through 456.i to represent the final digital output signal 450 based upon a logic control signal 458 as discussed above. Alternatively, in a second exemplary embodiment, the combining logic module 408 may provide one or more linear combinations of the composite digital output signals 456.1 through 456.i to represent the final digital output signal 450 based upon the logic control signal 458 in a similar manner as discussed above.

The logic module 606 provides the logic control signal 458 in a similar manner as the logic module 410 as discussed above. In an exemplary embodiment, the analog selection signal 656 is equal to the logic control signal 458. In another exemplary embodiment, the logic module 606 generates the analog selection signal 656 based on the signal metric of the analog input signal 150. The logic module 606 provides the analog selection signal 656 that causes the selecting module 602 to select a scaled analog input signal, such as scaled analog input signal 452.1 to provide an example, as the final analog input signal 652 when a ratio of a first scaling factor, such as the scaling factor $f_1$ to provide an example, and the signal metric of the analog input signal 150 is less than or equal the non-clipping input value $m_r$.

Alternatively, the logic module 606 provides the analog selection signal 656 that causes the selecting module 602 to select any of the scaled analog input signals 452.1 through 452.i as the final analog input signal 652 when ratios for each of the scaling factors $f_1$ through $f_i$ and the signal metric of the analog input signal 150 exceed the non-clipping input value $m_r$. In this situation, the logic module 606 usually produces the analog selection signal 656 that causes the selecting module 602 to select the scaled analog input signal 452.1 through 452.i corresponding to a greatest scaling factor.

Figure 7:
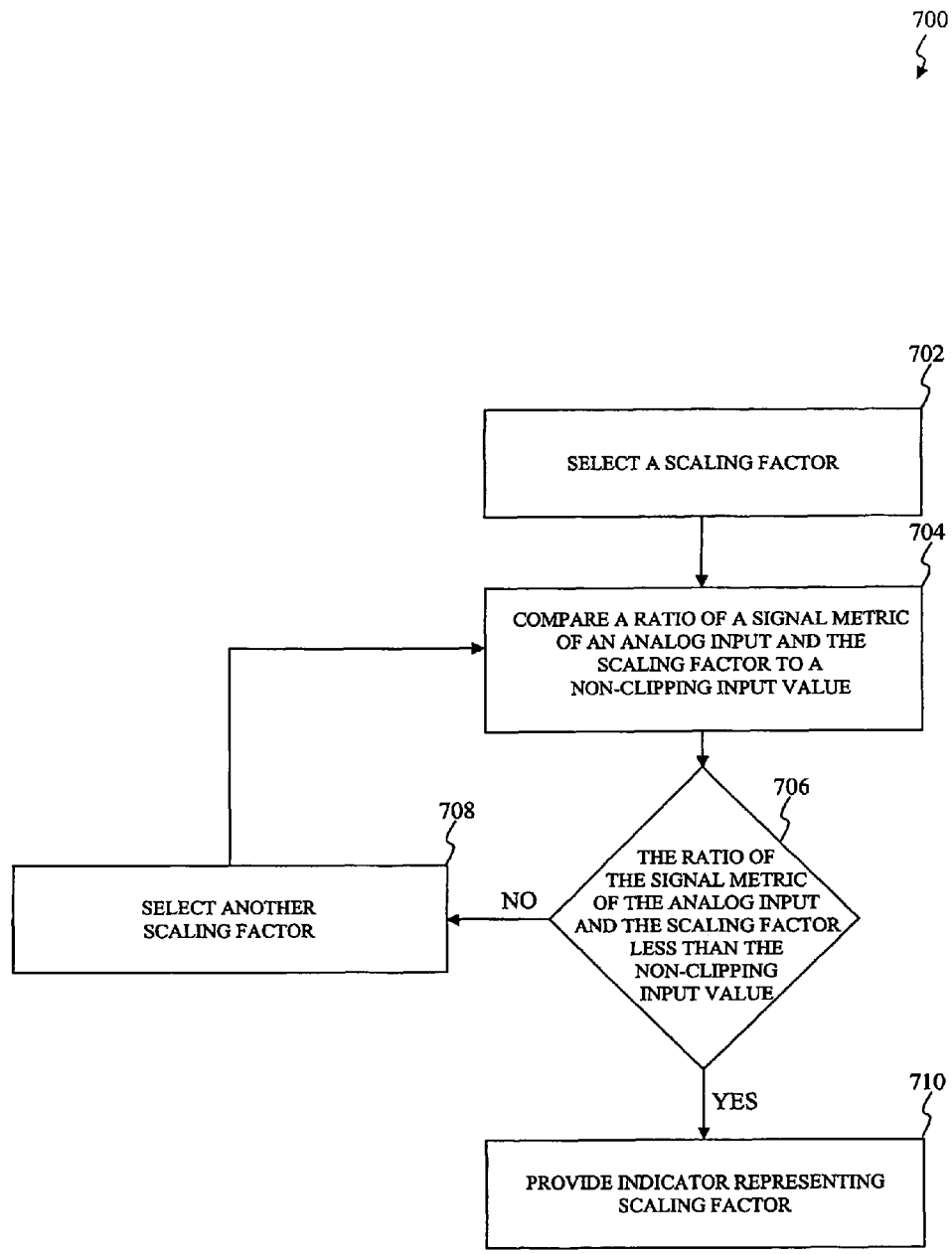
FIG. 7 is a flowchart of exemplary operational steps of a third logic module used in the composite ADC module according to a third aspect of the present invention.

FIG. 7 is a flowchart of exemplary operational steps of a third logic module used in the composite ADC module according to a third aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 7.

At step 702, an operational control flow 700 selects a scaling factor from one or scaling factors, such as the scaling factor $f_1$ through $f_i$.

At step 704, the operational control flow 700 compares a ratio of a signal metric of an analog input and the scaling factor from step 702 to a non-clipping input value, such as the non-clipping input value $m_r$ to provide an example. The non-clipping input value represents a ratio of the signal metric of the analog input signal and the scaling factor from step 702 that when exceeded causes one or more ADCs, such as the ADCs 404.1 through 404.i to provide an example, to clip. The signal metric of the analog input signal may include the mean, the total energy, the average power, the mean square, the instantaneous power, the root mean square, the variance, the norm, the voltage level and/or any other suitable signal metric of the analog input signal which will be apparent to one skilled in the relevant art(s).

At step 706, the operational control flow 700 proceeds to step 708 when the ratio of the signal metric of an analog input from step 704 and the scaling factor from step 702 is greater than or equal to the non-clipping input value of step 704. Otherwise, the operational control flow 700 proceeds to step 710 when the ratio of the signal metric of the analog input from step 704 and the scaling factor from step 702 is less than or equal to the non-clipping input value of step 702.

At step 708, the ratio of the signal metric of the analog input from step 704 and the scaling factor from step 702 is greater than or equal to the non-clipping input value of step 702 and/or the another non-clipping input value from step 708. The operational control flow 700 selects another scaling factor from the one or more scaling factors. The operational control flow 700 reverts back to step 706 to compare the ratio of the signal metric of an analog input and the another scaling factor to the non-clipping input value.

At step 710, the ratio of the signal metric of the analog input from step 704 and the scaling factor from step 702 is less than or equal to the non-clipping input value of step 702. The operational control flow 700 provides an indicator of the scaling factor of step 702 being greater than a ratio of the signal metric of the analog input from step 704 and the non-clipping input value of step 702. The operational control flow 700 may provide one or more logic control signals, such as the logic control signal 410 and/or the analog selection signal 656 to provide some examples, that corresponds to the scaling factor of step 702. The logic control signals cause one or more digital representations of the analog input signal corresponding to the logic control signals to be selected as a final digital output, such as the final output 450 to provide an example. Alternatively, the operational control flow 700 may provide a set of coefficients, such as the coefficients $c_1$ through $c_i$ to provide an example, via the logic control signals that corresponds to the scaling factor of step 702. The set of coefficients may be used to provide a linear combination of the one or more digital representations of the analog input signal as the final digital output.

CONCLUSION

It is to be appreciated that the Detailed Description section, and not the Abstract section, is intended to be used to interpret the claims. The Abstract section may set forth one or more, but not all exemplary embodiments, of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail may be made therein without departing from the spirit and scope of the invention. Thus, the present invention should not be limited by any of the above-described exemplary embodiments, but should be defined only in accordance with the following claims and their equivalents.

What is claimed is:

1. A composite analog to digital converter (ADC) to convert an analog input to a digital output signal, comprising:
   a first ADC, corresponding to a first non-clipping input value at which the first ADC saturates or clips, configured to convert the analog input to a first intermediate digital signal;
   a second ADC, corresponding to a second non-clipping input value at which the second ADC saturates or clips, configured to convert the analog input to a second intermediate digital signal, the second non-clipping input value being greater than the first non-clipping input value; and
   a combining logic module configured to select the first intermediate digital signal or the second intermediate digital signal based on a signal metric of the analog input to produce the digital output signal.

2. The composite ADC of claim 1, wherein the first intermediate digital signal and the second intermediate digital signal include a substantially similar number of bits.

3. The composite ADC of claim 1, where in the signal metric includes at least one of:
   a mean of the analog input;
   a total energy of the analog input;
   an average power of the analog input;
   a mean square of the analog input;
   an instantaneous power of the analog input;
   a root mean square of the analog input;
   a variance of the analog input;
   a norm of the analog input; and
   a voltage level of the analog input.

4. The composite ADC of claim 1, wherein the combining logic module comprises:
   a switching logic module configured to generate a selection signal based on the signal metric; and
   a switching module configured to select the first intermediate digital signal or the second intermediate digital signal based on the selection signal to produce the digital output signal.

5. The composite ADC of claim 4, wherein the switching logic module includes a first threshold corresponding to the first non-clipping input value and a second threshold corresponding to the second non-clipping input value, and wherein the selection signal causes the switching module to select the first intermediate digital signal when the signal metric is substantially less than the first threshold and to select the second intermediate digital signal when the signal metric is substantially less than the second threshold.

6. The composite ADC of claim 5, wherein the selection signal causes the switching module to select the second intermediate digital signal when the signal metric is substantially greater than the second threshold.

7. A composite analog to digital converter (ADC) to convert an analog input to a digital output signal, comprising:
   a first scaling module to divide the analog input by a first scaling factor to produce a first scaled analog input;
   a first ADC corresponding to a non-clipping input value configured to convert the first scaled analog input to produce a first scaled digital output signal;

a second scaling module to multiply the first scaled digital output signal by the first scaling factor to produce a first intermediate digital signal;

a third scaling module to divide the analog input by a second scaling factor to produce a second scaled analog input;

a second ADC corresponding to the non-clipping input value configured to convert the second scaled analog input to produce a second scaled digital output signal;

a fourth scaling module to multiply the second scaled digital output signal by the second scaling factor to produce a second intermediate digital signal; and a combining logic module configured to select the first intermediate digital signal or the second intermediate digital signal based on a signal metric of the analog input to produce the digital output signal.

8. The composite ADC of claim 7, where in the signal metric includes at least one of:
   a mean of the analog input;
   a total energy of the analog input;
   an average power of the analog input;
   a mean square of the analog input;
   an instantaneous power of the analog input;
   a root mean square of the analog input;
   a variance of the analog input;
   a norm of the analog input; and
   a voltage level of the analog input.

9. The composite ADC of claim 7, wherein the combining logic module comprises:
   a switching logic module configured to generate a selection signal based on the signal metric; and
   a switching module configured to select the first intermediate digital signal or the second intermediate digital signal based on the selection signal to produce the digital output signal.

10. The composite ADC of claim 9, wherein the switching logic module includes a threshold corresponding to the non-clipping input value, and wherein the selection signal causes the switching module to select the first intermediate digital signal when a ratio of the signal metric and the first scaling factor is substantially less than the threshold and to select the second intermediate digital signal when a ratio of the signal metric and the second scaling factor is substantially less than the threshold.

11. The composite ADC of claim 10, wherein the selection signal causes the switching module to select the second intermediate digital signal when the ratio of the signal metric and the second scaling factor is substantially greater than the threshold.

12. A composite analog to digital converter (ADC) to convert an analog input to a digital output signal, comprising:
   a first scaling module to divide the analog input by a first scaling factor to produce a first scaled analog input;
   a second scaling module to divide the analog input by a second scaling factor to produce a second scaled analog input;
   a first combining logic module configured to select the first scaled analog input or the second scaled analog input based on a signal metric of the analog input to produce a final scaled analog input;
   an ADC including a non-clipping input value configured to convert the final scaled analog input to produce a composite digital output signal;
   a third scaling module to multiply the composite digital output signal by the first scaling factor to produce a first intermediate digital signal;
   a fourth scaling module to multiply composite digital output signal by the second scaling factor to produce a second intermediate digital signal; and
   a combining logic module configured to select the first intermediate digital signal or the second intermediate digital signal based on the signal metric of the analog input to produce the digital output signal.

13. The composite ADC of claim 12, where in the signal metric includes at least one of:
   a mean of the analog input;
   a total energy of the analog input;
   an average power of the analog input;
   a mean square of the analog input;
   an instantaneous power of the analog input;
   a root mean square of the analog input;
   a variance of the analog input;
   a norm of the analog input; and
   a voltage level of the analog input.

14. The composite ADC of claim 12, wherein the first combining logic module comprises:
   a switching logic module configured to generate a selection signal based on the signal metric; and
   a first switching module configured to select the first scaled analog input or the second scaled analog input based on the selection signal to produce the final scaled analog input.

15. The composite ADC of claim 14, wherein the switching logic module includes a threshold corresponding to the non-clipping input value, and wherein the selection signal causes the first switching module to select the first scaled analog input when a ratio of the signal metric and the first scaling factor is substantially less than the threshold and to select the second scaled analog input when a ratio of the signal metric and the second scaling factor is substantially less than the threshold.

16. The composite ADC of claim 15, wherein the selection signal causes the first switching module to select the second scaled analog input when the ratio of the signal metric and the second scaling factor is substantially greater than the threshold.

17. The composite ADC of claim 14, wherein the second combining logic module comprises:
   a second switching module configured to select the first intermediate digital signal or the second intermediate digital signal based on the selection signal to produce the digital output signal.

18. The composite ADC of claim 17, wherein the switching logic module includes a threshold corresponding to the non-clipping input value, and wherein the selection signal causes the second switching module to select the first scaled analog input when a ratio of the signal metric and the first intermediate digital signal is substantially less than the threshold and to select the second intermediate digital signal when a ratio of the signal metric and the second intermediate digital signal is substantially less than the threshold.

19. The composite ADC of claim 18, wherein the selection signal causes the second switching module to select the second intermediate digital signal when the ratio of the signal metric and the second scaling factor is substantially greater than the threshold.

* * * * *